United States Patent
Sinnema et al.

(10) Patent No.: US 6,998,842 B2
(45) Date of Patent: Feb. 14, 2006

(54) MRI APPARATUS WITH LOW-FREQUENCY CABLE INTEGRATED INTO THE PATIENT CARRIER

(75) Inventors: Dirk Sinnema, Eindhoven (NL); Johan Ernst Willy Vrijheid, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/498,730

(22) PCT Filed: Dec. 18, 2002

(86) PCT No.: PCT/IB02/05634

§ 371 (c)(1),
(2), (4) Date: Jun. 15, 2004

(87) PCT Pub. No.: WO03/054567

PCT Pub. Date: Jul. 3, 2003

(65) Prior Publication Data

US 2005/0033152 A1  Feb. 10, 2005

(30) Foreign Application Priority Data

Dec. 21, 2001 (EP) .................................. 01205138

(51) Int. Cl.
*G01V 3/00* (2006.01)
*A61B 5/055* (2006.01)
(52) U.S. Cl. ...................... 324/318; 600/410; 324/307
(58) Field of Classification Search ........ 324/300–322; 600/410, 411, 421
See application file for complete search history.

(56) References Cited

U.S. PATENT DOCUMENTS

| | | | | |
|---|---|---|---|---|
| 4,922,204 A | * | 5/1990 | Duerr et al. | 324/322 |
| 5,065,760 A | * | 11/1991 | Krause et al. | 600/421 |
| 5,602,478 A | * | 2/1997 | Salloway et al. | 324/318 |
| 5,638,001 A | * | 6/1997 | Vrijheid et al. | 324/318 |
| 6,218,836 B1 | * | 4/2001 | Vrijheid | 324/318 |
| 6,219,570 B1 | * | 4/2001 | Mueller et al. | 600/410 |
| 6,496,006 B1 | * | 12/2002 | Vrijheid | 324/318 |
| 2002/0095084 A1 | * | 7/2002 | Vrijheid et al. | 600/411 |

FOREIGN PATENT DOCUMENTS

| | | | |
|---|---|---|---|
| EP | WO 0099/32898 | * | 7/1999 |
| WO | WO 00/77926 A1 | | 12/2000 |

* cited by examiner

*Primary Examiner*—Brij Shrivastav
*Assistant Examiner*—Tiffany A. Fetzner
(74) *Attorney, Agent, or Firm*—Thomas M. Lundin

(57) ABSTRACT

In a medical MRI apparatus, it is often desirable to have devices 62, 64 for communicating with or monitoring the patient 58 in the imaging volume 29 of the apparatus. Such devices need DC power or low-frequency connections with an area 70 outside the imaging volume. A device cable that does not interfere with the MRI magnetic fields is known per se. The invention proposes to fix the device cable in a groove 76 in the patient carrier 60 in such a manner that its strip-shaped conductors 78, 80 extend parallel to the field lines of the stationary field B of the apparatus. In this way, it is also possible to clip device carriers 72, 74 to the groove, thus supplying the devices with DC power or establishing an audio connection through the device cable in the groove.

12 Claims, 3 Drawing Sheets

MRI APPARATUS WITH LOW-FREQUENCY CABLE INTEGRATED INTO THE PATIENT CARRIER

BACKGROUND

The invention relates to a medical MRI apparatus provided with a patient table having an elongated patient carrier the longitudinal direction of which, if said patient carrier is placed in the imaging volume of the MRI apparatus, coincides with the direction of the stationary magnetic field in the imaging volume, which medical MRI apparatus is provided with at least one device cable for low-frequency electric conduction, which device cable comprises mutually separated segments which are each shorter than a predetermined value, and wherein the segments are separated from each other by frequency-dependent separation elements forming a conductor for low-frequency currents and an insulator for radio-frequency alternating current.

Such an MRI apparatus is known from the published European patent application No. 1 105 966. In this known MRI apparatus, a mobile patient table can be used to take the patient to be examined up to the MRI apparatus. On the patient table there is a patient carrier on which the patient lies. Next, the patient on the patient carrier is moved from the patient table into the imaging volume of the apparatus. In the imaging volume there is a device in the form of a television camera for monitoring the patient during recording the MRI image. The power supply of the television camera takes place via a segmented device cable comprised of segments which are each shorter than ¼ wavelength of the radio-frequency radiation generated in the MRI apparatus to produce the MRI image. The segments are separated from each other by self-inductance elements which, as is known, form a conductor for DC current and low-frequency signals and an insulator for high-frequency signals. In this case, low-frequency signals are to be taken to mean signals having a frequency up to for example 20 kHz, so that they also include audio signals, while high-frequency signals are to be taken to mean signals having a frequency above, for example, 20 MHz. In a typical MRI apparatus with a stationary field of for example 1.5 T, the radio-frequency signal has a frequency of approximately 64 MHz. The self-inductance elements thus form an insulator for the high frequencies and a conductor for the low frequencies. As a result, the cable thus segmented does not cause the antenna for emitting said high frequencies (referred to as RF body coil in an MRI apparatus) to become non-resonant, which would be the case if use were made of an unsegmented cable and hence RF excitation of the tissue to be imaged would no longer take place, so that MRI imaging would be impossible.

It is possible that a patient has to be examined under conditions where he is surrounded by a large number of devices which all require electric power and/or require low-frequency signal exchange with the environment. Apart from television cameras, said devices are, for example, devices for transferring physiologic quantities such as pulse beat, blood pressure, temperature or ECG data to devices for communication, such as audio communication with the patient, and to devices for illumination in the imaging volume of the MRI apparatus. This would result in the presence of a large number of device cables around and over the patient, which is inconvenient for the staff attending the patient and unpleasant for the patient himself.

SUMMARY

It is an object of the invention to provide a system enabling connections to be set up to the devices to be used in the imaging volume, such that disturbing influences on the operation of the MRI apparatus are precluded, and a plurality of device cables are not necessary.

To achieve this, the MRI apparatus in accordance with the invention is characterized in that the device cable is rigidly connected throughout its length to the patient carrier and extends in the longitudinal direction of the patient carrier, and in that the device cable is embodied so as to be capable of being branched off. The longitudinal direction of the patient carrier and hence the direction of the device cable coincides with the direction of the stationary field of the MRI apparatus. As a result, any magnetic field originating from this cable extends perpendicularly to the stationary field of the apparatus, so that no component is generated that disturbs this stationary field. Since the device cable is embodied so as to be capable of being branched off, it is achieved that each device to be used in the imaging volume can be connected to the device cable at the location where it is situated during use. As a result, there are no device cables that extend from each device to a connection point outside the imaging volume.

In a preferred embodiment of the invention, the patient carrier is provided with a groove in its longitudinal direction, which groove accommodates the device cable. It is thus achieved that the device cable does not have projections that might be inconvenient for the patient and/or the staff treating the patient.

In addition, the device cable can be readily fixed in a groove, so that the direction of this cable is always well-defined.

In a further preferred embodiment of the invention, the groove is present in a side edge of the patient carrier, such that the opening of the groove faces away from the patient carrier. This embodiment has the advantage that the groove cannot easily be contaminated during operation while the accessibility thereof with a view to connecting the devices is maintained.

In yet another preferred embodiment of the invention, the conductors in the segments of the device cable take the form of strips, which strips are provided so as to be in contact with the side walls of the groove. This embodiment has the advantage that the strips are fixed against the walls of the groove, so that their positional definition is maximal, and the branching-off for the devices can take place in a simple manner, for example, by clamping a contact block in the groove at the end of the device connection cable.

In a different embodiment of the invention, the MRI device is provided with a device which is to be arranged in or near the imaging volume, which device is provided with a connection cable which can be connected to the device cable, which connection cable comprises mutually separated segments which are each shorter than a predetermined value, and wherein the separation between the segments is brought about by frequency-dependent separation elements forming a conductor for low-frequency currents and an insulator for radio-frequency alternating current. This embodiment is advantageous if the device has a comparatively long connection cable or if the connection cable must transfer a comparatively large current. In this case, a segmented connection cable does not electromagnetically disturb the electromagnetic fields of the MRI apparatus, and also the connection cable itself is not influenced by these fields.

In yet another embodiment of the invention, the device is arranged to maintain a signal connection to an area outside the imaging volume via a high-frequency carrier wave. In this embodiment, signal-carrying conductors are not necessary as signal transfer is wireless, for example, via a 2.4 GHz carrier wave. Such equipment is commercially available.

In a still further embodiment of the invention, the device is situated in an envelope provided with a protective layer that provides shielding against electromagnetic radiation from the device to the imaging volume. A number of devices to be used are provided with active electronic components, such as said television camera. As an MRI apparatus is very sensitive to small field disturbances, these devices must not emit interference fields. This effect is achieved by means of said shielding.

In a further embodiment of the invention, the protective layer is made of a material having a resistivity below 0.05 $\Omega$m, the protective layer has a thickness below 40 $\mu$m, and the total surface area of the protective layer is smaller than 100 cm$^2$.

In experiments it has been found that said values enable a good shielding to be achieved while, in addition, this shielding does not become a source of disturbing eddy currents, which can be generated by the gradient fields of the MRI apparatus.

In yet another embodiment of the invention, the frequency-dependent separation elements are embodied so as to be bifilarly wound self-inductance elements.

The self-inductance elements (coils) can be oriented such that the magnetic field that they cause extends perpendicularly to the stationary field of the MRI apparatus, however, it is possible that a wrong orientation still leads to a component being generated in the direction of the stationary field. In the case of a bifilarly wound coil, a negligibly small magnetic field is caused, so that orientation errors do not cause the stationary field to be disturbed.

Still further advantages of the present invention will be appreciated to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

Figure 1:
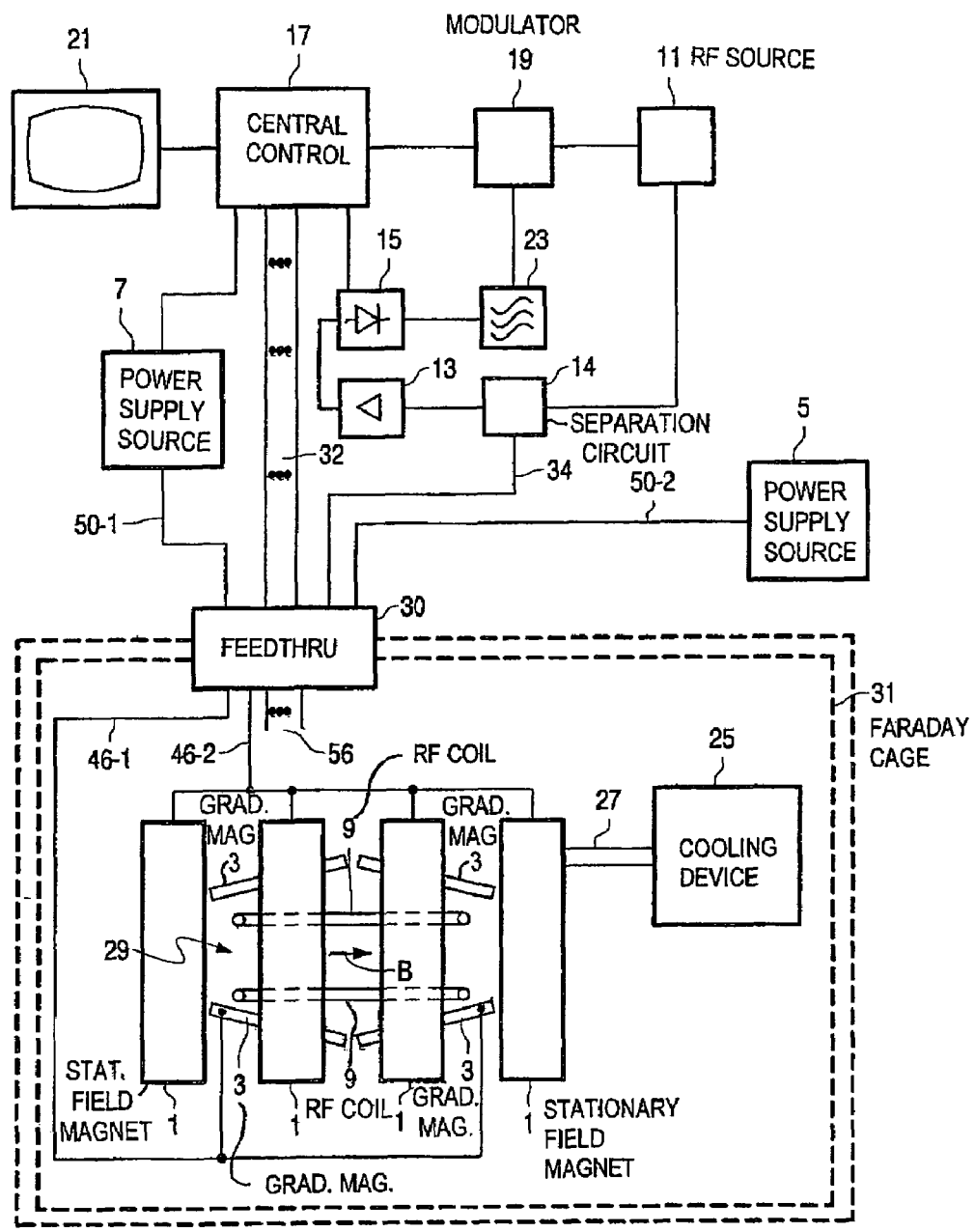
FIG. 1 diagrammatically shows the general construction of a magnetic resonance apparatus wherein the invention can be applied.

The magnetic resonance apparatus (MRI apparatus) diagrammatically shown in FIG. 1 comprises a first magnetic system 1 for generating a homogeneous stationary magnetic field B, a second magnetic system 3 for generating magnetic gradient fields, a power supply source 5 for the first magnetic system 1 and a power supply source 7 for the second magnetic system 3. A radio-frequency coil (RF coil) 9 is used to generate a radio-frequency magnetic alternating field and is connected, for this purpose, to an RF transmission device with a radio-frequency source 11. To detect electron spin resonance signals generated by the radio-frequency transmission field in an object to be examined (not shown), use can alternatively be made of the RF coil 9, which is connected, for this purpose, to an RF receiving device comprising a signal amplifier 13. The output of the signal amplifier 13 is connected to a detector circuit 15 that is connected to a central control device 17. Said central control device 17 further controls a modulator 19 for the RF source 11, the power supply source 7 and a monitor 21 for image display. A high-frequency oscillator 23 controls both the modulator 19 and the detector 15 processing measuring signals. The forward and backward RF signal traffic are separated from each other by a separation circuit 14. For cooling the magnetic coils of the first magnetic system 1 use is made of a cooling device 25 having coolant lines 27. The RF coil 9 arranged within the magnetic systems 1 and 3 encloses an imaging volume 29 which in the case of a device for producing images for medical applications is large enough to embrace a patient to be examined or a part of a patient to be examined, for example the head and the neck. In the imaging volume 29, a stationary magnetic field B, object-sections selecting gradient fields, and a spatially homogeneous RF alternating field can thus be generated. The RF coil 9 can combine the functions of transmitting coil and measuring coil. For both functions, use can alternatively be made of different coils, for example of surface coils as measuring coils. The assembly of coils 1, coil 9 and second magnetic system (gradient coils) 3 is surrounded by a Faraday cage 31 that provides shielding from RF fields.

A power supply line 50-1 extends from the power supply source 7 to the feedthrough device 30; also a power supply line 50-2 extends from the power supply source 5 to the feedthrough device 30. The central control device 17 and the various parts to be controlled (not shown) of the MRI apparatus within the Faraday cage 31 are interconnected by means of connection lines 32 which are connected via the feedthrough device 30 to said parts to be controlled. In addition, an RF connection line 34 is provided between the separation circuit 14 and the feedthrough device. Inside the Faraday cage, the power supply line 50-1 continues as connection line 46-1, and the power supply line 50-2 continues as connection line 46-2. The bundle of connection lines 32 is continued within the Faraday cage as the bundle of connection lines 56.

Figure 2:
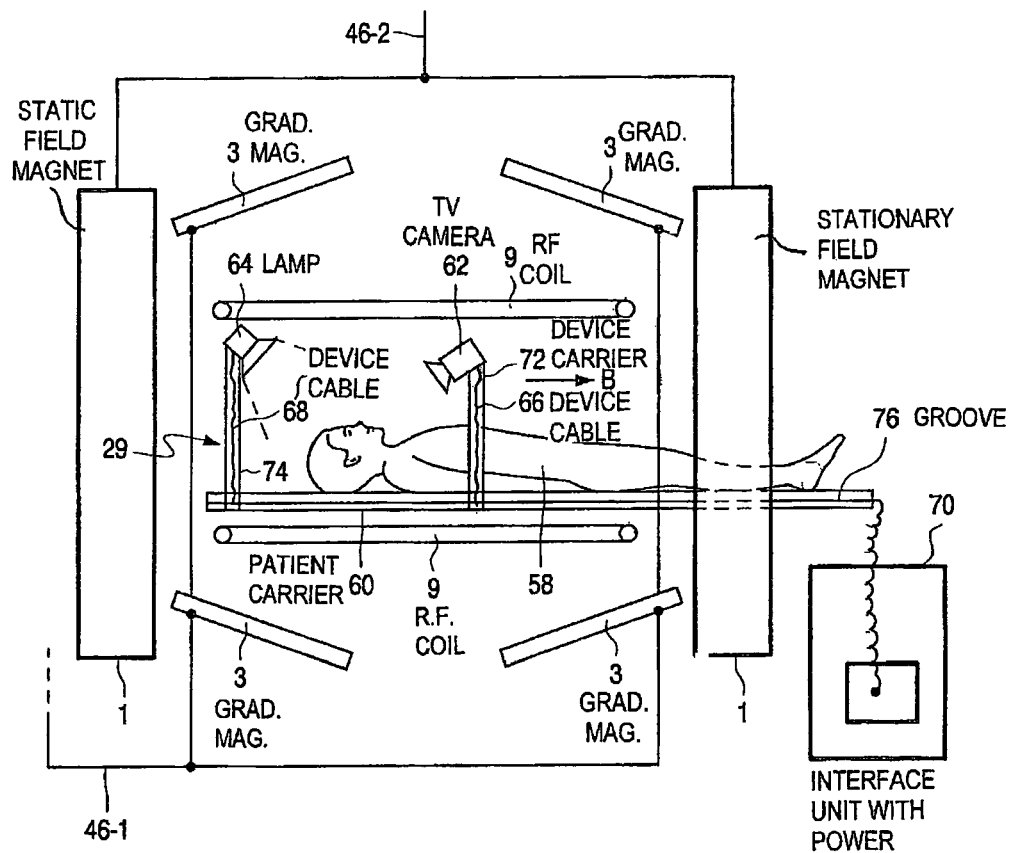
FIG. 2 is a more detailed view of the imaging volume of the magnetic resonance apparatus in accordance with FIG. 1.

FIG. 2 shows the imaging volume of the MRI apparatus of FIG. 1 in greater detail. For the sake of clarity, only two coils of the first magnetic system 1 for generating a homogeneous stationary magnetic field B are shown. In the imaging volume 29, a patient 58 to be examined is placed on a patient carrier 60 in such a manner that sectional images of the head and the neck can be produced. Within the imaging volume 29, or in the direct vicinity thereof, electrical connection equipment for maintaining a connection with the patient to be examined is present, in this case a TV camera 62 and a lamp 64 for illuminating the field of view to be recorded by the camera. It is to be noted, however, that other electrical connection equipment can alternatively be provided in or near the imaging volume, such as sensors for recording blood pressure, heart beat or brain activity of the patient, or for carrying out bidirectional communication with the patient.

The TV camera 62 and the lamp 64 are supplied with power from supply apparatus 70 via a respective supply conductor 66 and 68. The two supply conductors 66 and 68 extend through the homogeneous magnetic field B and through the RF field generated by the coils 9. The present invention provides measures to preclude that the RF field generated by the coils 9 and/or the homogeneous magnetic field B are disturbed such that the quality of the sectional images to be produced by means of the MRI apparatus are adversely affected. The devices 62 and 64 can each be attached to the patient carrier 60 via a device carrier 72, 74, respectively, in a manner which will be described in greater detail with reference to FIG. 3. To supply power to these devices 62 and 64, said device carriers are each provided with a connection cable 66, 68, respectively, which extend through the preferably hollow device carriers. The connection cables electrically contact conductor strips in a groove 76 in the side face of the patient carrier 60, as will be described in greater detail with reference to FIG. 3. The conductor strips in groove 76 are connected to an interface unit 70 via a flexible, detachable cable. This interface unit may comprise a power source for feeding said devices, and it may also comprise filtering means for separating a possible low-frequency signal, such as an audio signal, from the DC power. Said measures for precluding disturbance of the MRI fields consist in that the connection cables 66 and 68 comprise mutually separated segments which are each shorter than a predetermined value, i.e. shorter than ¼ of the wavelength of the RF field and preferably shorter than 1/20 of said wavelength, and in which the separation between the segments is brought about by frequency-dependent separation elements forming a conductor for low-frequency currents and an insulator for radio-frequency alternating current. These frequency-dependent separation elements are preferably embodied so as to be bifilarly wound self-inductance elements. Said segments are embodied so as to be two twisted wires, as a result of which the current flowing through these wires generates an unnoticeable magnetic field outside the connection cable. Such connection cables are known per se from said European patent application No. 1 105 966.

Figure 3:
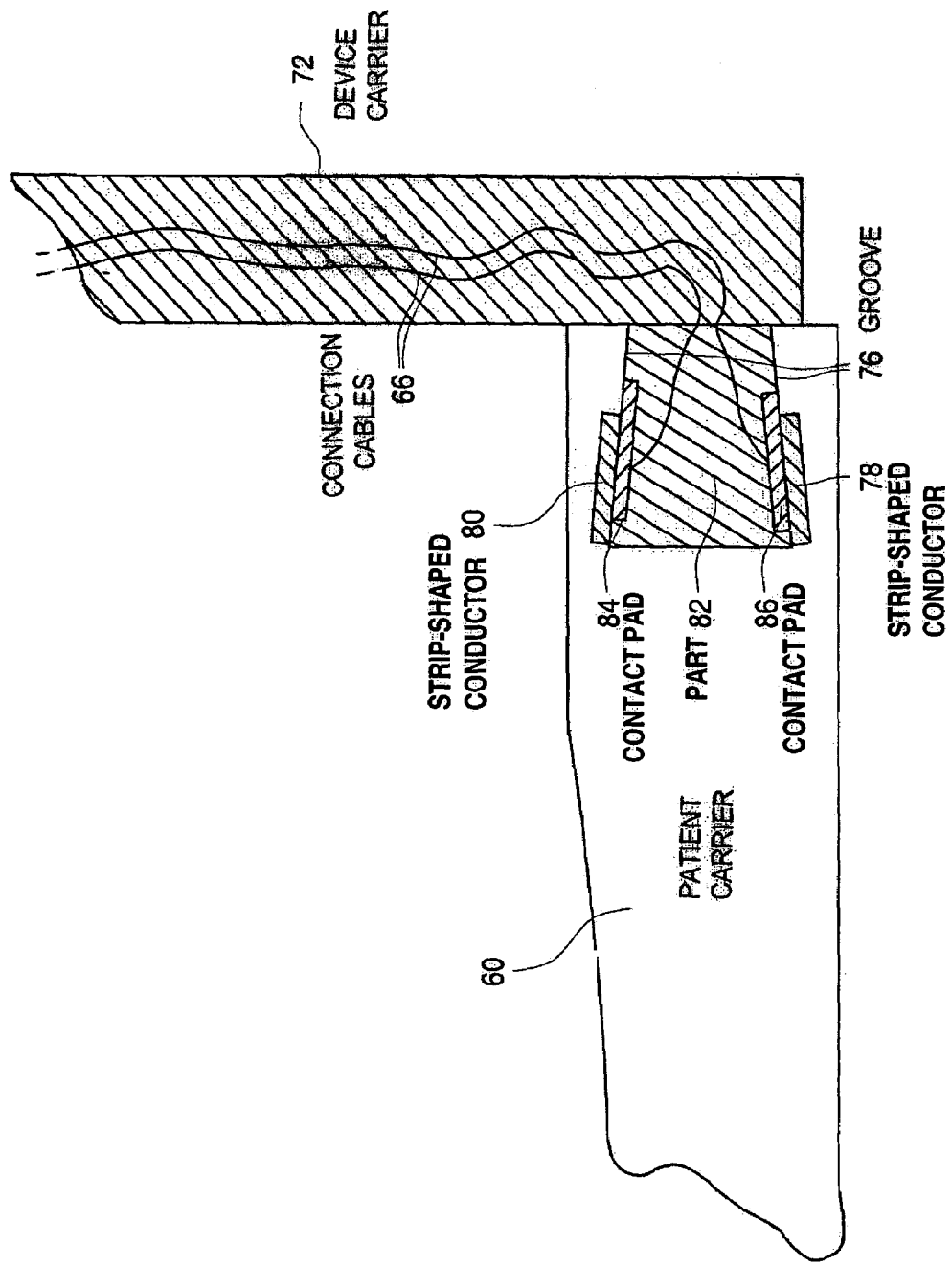
FIG. 3 is a cross-sectional view of the groove in the patient carrier wherein the device cable is provided.

FIG. 3 is a cross-sectional view of the groove in the patient carrier wherein the device cable is provided. A groove 76 is provided in the side face of patient carrier 60 in such a manner that the opening of this groove faces sideways, i.e. faces away from the patient carrier. Strip-shaped conductors 78 and 80 of the device cable are provided in the side walls of the groove. A device carrier 72 is detachably arranged in the groove. The manner in which the device carrier 72 is provided and removed is not relevant to the application of the invention; it is conceivable that the part 82 corresponding to the groove 76 is shifted from a cavity (not shown in the drawing) to its position in a direction perpendicular to the plane of the drawing. Contact pads 84 and 86 are provided in the side faces of the part 82, which contact pads electrically contact the strip-shaped conductors 80, 78, respectively, when the device carrier 72 is placed in the groove 76. The conductors 66 of the connection cable 66 are attached to the contact pads 84 and 86, as a result of which power can be delivered to the device placed on the device carrier 72.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

An envelope for an electronic device for use in MRI fields can be manufactured from printed circuit board such as customarily used as a support for electronic components. Such printed circuit board material has a thickness of, for example, 0.6 mm and is provided on one side with a layer of copper having a thickness of, for example, 17 μm. If a cube-shaped envelope is desired, a surface composed of five squares is formed from the printed circuit board material. At the locations where the squares are interconnected, weakening grooves having a depth of 0.4 mm are formed so as to enable the material to be folded more readily into a cube. At the angular points of the central square, circular holes are drilled so as to provide space during folding. Two additional holes are provided in the square that is to form the bottom of the cube, thus enabling feedthroughs for power supply and signal transfer to be provided. The plate material thus shaped is folded into a cube that is open on one side. In this process, the copper layer is maintained on the inside of the cube. After the open cube has been formed, a piece of printed circuit board material the size of which is equal to that of the missing side is formed, and this piece of material can be provided with electronic components and soldered onto the open side. In this manner, a shielded envelope is obtained which, as shown in experiments, is capable of counteracting disturbance of the MRI fields in such a manner that no observable image disturbance occurs, provided the shielding layer is made of a material whose resistivity is below 0.05 Ωm, the layer has a thickness below 40 μm, and the total surface area of the shielding layer is less than 100 cm$^2$.

What is claimed is:

1. A medical MRI apparatus with a bore provided with a patient table having an elongated patient carrier in the longitudinal direction that coincides with the direction of the stationary magnetic field B in the imaging volume of the MRI apparatus when the patient carrier is placed within the bore of the MRI apparatus, the medical MRI apparatus including:

at least one device cable configured for low-frequency electric conduction, which device cable comprises mutually separated segments which are each shorter than a predetermined value, and wherein the segments are separated from each other by frequency-dependent separation elements forming a conductor of low-frequency currents and an insulator of radio-frequency alternating current, the device cable being rigidly connected throughout its length to the patient carrier in the longitudinal direction of the patient carrier, the device cable being configured in order to enable free selective interconnection entirely along the length of the device cable with an associated device also located within the bore of the MRI apparatus.

2. The medical MRI apparatus as claimed in claim 1, provided with an associated device which is to be arranged in or near the imaging volume, which associated device is provided with a connection cable which is connectable to the device cable, which connection cable comprises mutually separated segments which are each shorter than a predetermined value, and wherein the separation between the segments is the result of frequency-dependent separation elements forming a conductor of low-frequency currents and an insulator of radio-frequency alternating current.

3. The medical MRI apparatus as claimed in claim 2, wherein the associated device is arranged in order to maintain a signal connection to an area outside the imaging volume via a high-frequency carrier wave.

4. A medical MRI apparatus with a bore provided with a patient table having an elongated patient carrier in the longitudinal direction that coincides with the direction of the stationary magnetic field B in the imaging volume when the patient carrier is placed within the bore of the MRI apparatus, the patient carrier including:

a groove along the length of the patient carrier's longitudinal direction at least one device cable configured for low-frequency electric conduction, fixedly connected within the groove along the length of the groove, which device cable includes mutually separated segments which are each shorter than a predetermined value, which segments are separated from each other by frequency-dependent separation elements forming a conductor of low-frequency currents and an insulator of radio-frequency alternating current; and an associated device located within the bore of the MRI apparatus, which is configured to be selectively connectable anywhere along the groove of the patient carrier in order to make at least one electrical connection with the segments of the device cable.

5. The medical MRI apparatus as claimed in claim 4, wherein the groove is present in a side edge of the patient carrier, such that the opening of the groove faces away from the patient carrier.

6. The medical MRI apparatus as claimed in claim 5, wherein the conductors in the segments of the device cable take the form of strips, which strips are provided so as to contact the side walls of the groove.

7. A patient carrier configured to position an associated object in an imaging volume within a bore of an MRI apparatus with a longitudinal axis of the patient carrier being parallel to a stationary magnetic field of the MRI apparatus, the patient carrier including:

a longitudinal mounting groove extending longitudinally along a side of the patient carrier, the longitudinal groove being configured in order to selectively mount an associated device at freely selectable positions along substantially the entire length of the groove; and conductive strips mounted within the groove that enable electrical contact with contacts of the associated device when the associated device contacts are mounted in the groove, the conductive strips extending parallel to the stationary magnetic field of the MRI apparatus and being divided into a plurality of segments which are interconnected with frequency dependent separation elements.

8. A medical MRI apparatus with a bore including a patient carrier configured for positioning an associated object in an imaging volume, the patient carrier having a longitudinal axis which is parallel to a stationary magnetic field of the MRI apparatus in the imaging volume, the patient carrier including:

a longitudinal mounting groove extending longitudinally along a side of the patient carrier, the longitudinal groove being configured in order to selectively mount an associated device at freely selectable positions along substantially the entire length of the groove; and conductive strips mounted within the groove that enable electrical contact with contacts of said associated device when the contacts of the associated device are mounted in the groove, the conductive strips extending parallel to the stationary magnetic field of the MRI apparatus and being divided into a plurality of segments which are interconnected with frequency dependent separation elements.

9. The medical MRI apparatus as claimed in claim 8, wherein the segments are shorter longitudinally than of a wavelength at a magnetic resonance frequency in the imaging volume.

10. The medical MRI apparatus as claimed in claim 8, wherein the frequency-dependent separation elements are embodied so as to be bifilarly wound self-inductance elements.

11. The medical MRI apparatus as claimed in claim 8, wherein the associated device is situated in a housing including a protective layer that provides shielding against electromagnetic radiation emitted from the associated device to the imaging volume.

12. The medical MRI apparatus as claimed in claim 11, wherein the protective layer is made of a material having a resistivity below 0.05 $\Omega$m, wherein the protective layer has a thickness below 40 $\mu$m, and wherein the total surface area of the protective layer is smaller than 100 cm$^2$.

* * * * *